(12) United States Patent
Kobayashi et al.

(10) Patent No.: US 11,821,104 B2
(45) Date of Patent: Nov. 21, 2023

(54) APPARATUS FOR MANUFACTURING SINGLE CRYSTAL

(71) Applicant: SHIN-ETSU HANDOTAI CO., LTD., Tokyo (JP)

(72) Inventors: Takumi Kobayashi, Chiyoda-ku (JP); Kazuya Yanase, Nishigo-mura (JP); Atsushi Okai, Nishigo-mura (JP); Susumu Sonokawa, Nishigo-mura (JP); Atsushi Iwasaki, Echizen (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 294 days.

(21) Appl. No.: 17/435,224

(22) PCT Filed: Dec. 26, 2019

(86) PCT No.: PCT/JP2019/051060
§ 371 (c)(1),
(2) Date: Aug. 31, 2021

(87) PCT Pub. No.: WO2020/188947
PCT Pub. Date: Sep. 24, 2020

(65) Prior Publication Data
US 2022/0136130 A1    May 5, 2022

(30) Foreign Application Priority Data
Mar. 20, 2019   (JP) ................................. 2019-053430

(51) Int. Cl.
C30B 15/14    (2006.01)
C30B 15/00    (2006.01)
(Continued)

(52) U.S. Cl.
CPC ............ *C30B 15/14* (2013.01); *C30B 15/007* (2013.01); *C30B 15/10* (2013.01); *C30B 15/20* (2013.01)

(58) Field of Classification Search
CPC ....... C30B 15/14; C30B 15/007; C30B 15/10; C30B 15/20; Y10T 117/1068
See application file for complete search history.

(56) References Cited

U.S. PATENT DOCUMENTS

| 4,330,362 A | 5/1982 | Zulehner |
| 5,911,822 A | 6/1999 | Abe et al. |

(Continued)

FOREIGN PATENT DOCUMENTS

| DE | 112008003609 T5 | 2/2011 |
| DE | 112013001054 T5 | 12/2014 |

(Continued)

OTHER PUBLICATIONS

Sep. 16, 2021 International Preliminary Report on Patentability issued in International Patent Application No. PCT/JP2019/051060.

(Continued)

*Primary Examiner* — Robert M Kunemund
(74) *Attorney, Agent, or Firm* — Oliff PLC

(57) ABSTRACT

An apparatus for manufacturing a single crystal according to a Czochralski method, including: a main chamber housing crucibles for a raw-material melt and heater for heating the raw-material melt; a pulling chamber at an upper portion of the main chamber and a single crystal pulled from the raw-material melt; a cooling cylinder extending from a ceiling portion of the main chamber toward a surface of the raw-material melt to surround the single crystal; an auxiliary cooling cylinder inside the cooling cylinder; and a diameter-enlargement member to fit into the auxiliary cooling cylinder. The auxiliary cooling cylinder has a slit penetrating in (Continued)

an axial direction to come into close contact with the cooling cylinder by pushing the diameter-enlargement member into the auxiliary cooling cylinder to enlarge the diameter of the auxiliary cooling cylinder. This enables efficient cooling of a growing single crystal and increases the growth rate of the single crystal.

12 Claims, 4 Drawing Sheets

(51) Int. Cl.
  *C30B 15/10* (2006.01)
  *C30B 15/20* (2006.01)

(56) References Cited

U.S. PATENT DOCUMENTS

| | | | |
|---|---|---|---|
| 6,048,395 A | 4/2000 | Iida et al. | |
| 6,776,840 B1 * | 8/2004 | Fuerhoff | C30B 15/22 117/14 |
| 6,783,621 B1 * | 8/2004 | Georges | C23C 16/045 156/169 |
| 7,141,113 B1 * | 11/2006 | Nakamura | C30B 15/203 117/2 |
| 7,594,966 B2 * | 9/2009 | Hoshi | C30B 29/06 117/34 |
| 9,217,208 B2 * | 12/2015 | Hoshi | C30B 15/20 |
| 2003/0070605 A1 | 4/2003 | Hoshi et al. | |
| 2010/0258050 A1 | 10/2010 | Hoshi et al. | |
| 2012/0043112 A1 | 2/2012 | Persson et al. | |
| 2015/0020728 A1 * | 1/2015 | Hoshi | C30B 15/203 117/15 |
| 2015/0240380 A1 * | 8/2015 | Hoshi | C30B 15/206 117/14 |
| 2022/0136130 A1 * | 5/2022 | Kobayashi | C30B 15/007 117/13 |

FOREIGN PATENT DOCUMENTS

| | | |
|---|---|---|
| EP | WO2019124442 * | 12/2018 |
| JP | S49-075964 A | 7/1974 |
| JP | S57-040119 B2 | 8/1982 |
| JP | S64-065086 A | 3/1989 |
| JP | H06-199590 A | 7/1994 |
| JP | H10-203898 A | 8/1998 |
| JP | H11-157996 A | 6/1999 |
| JP | 2002-068887 A | 3/2002 |
| JP | 2009-161416 A | 7/2009 |
| JP | 2011-045923 A | 3/2011 |
| JP | 2012-525671 A | 10/2012 |
| JP | S614380 B1 | 12/2019 |
| WO | 01/057293 A1 | 8/2001 |

OTHER PUBLICATIONS

Mar. 10, 2020 International Search Report issued in International Patent Application No. PCT/JP2019/051060.

Aug. 7, 2023 Office Action issued in German Patent Application No. 11 2019 006 883.0.

* cited by examiner

[FIG. 1]
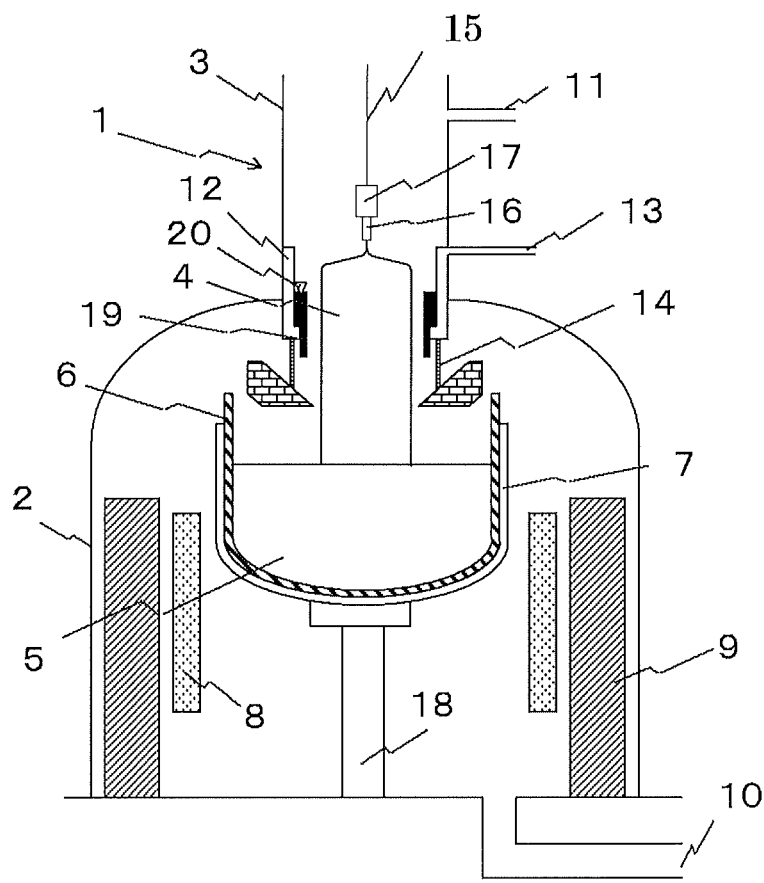
[FIG. 2]
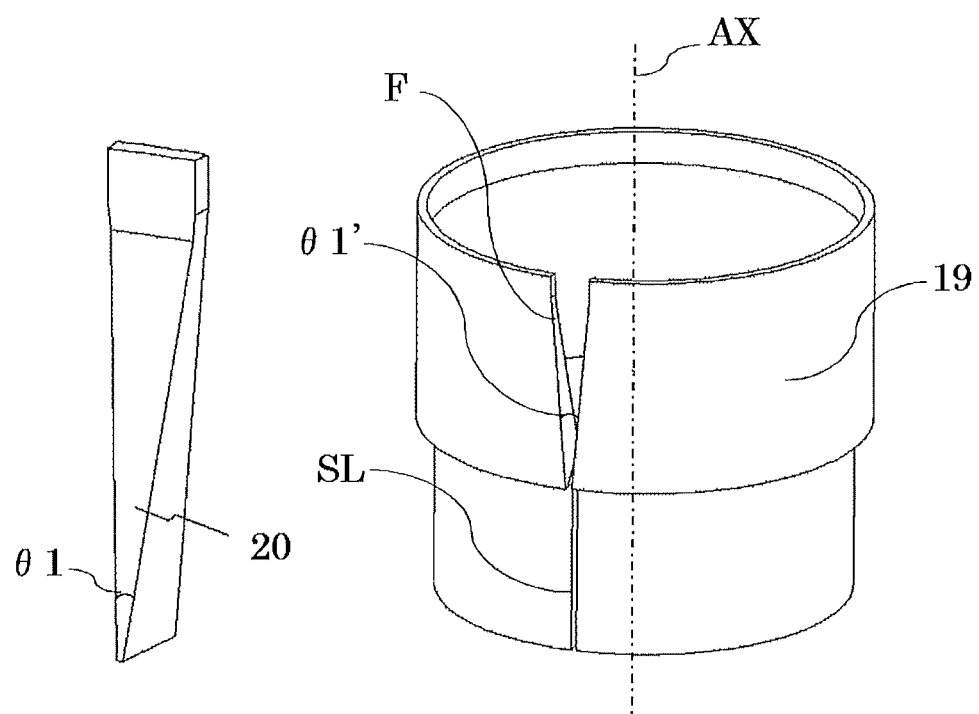

[FIG. 3]
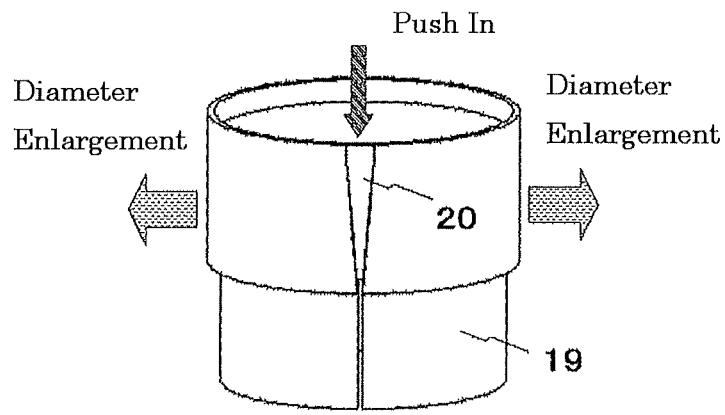
[FIG. 4]
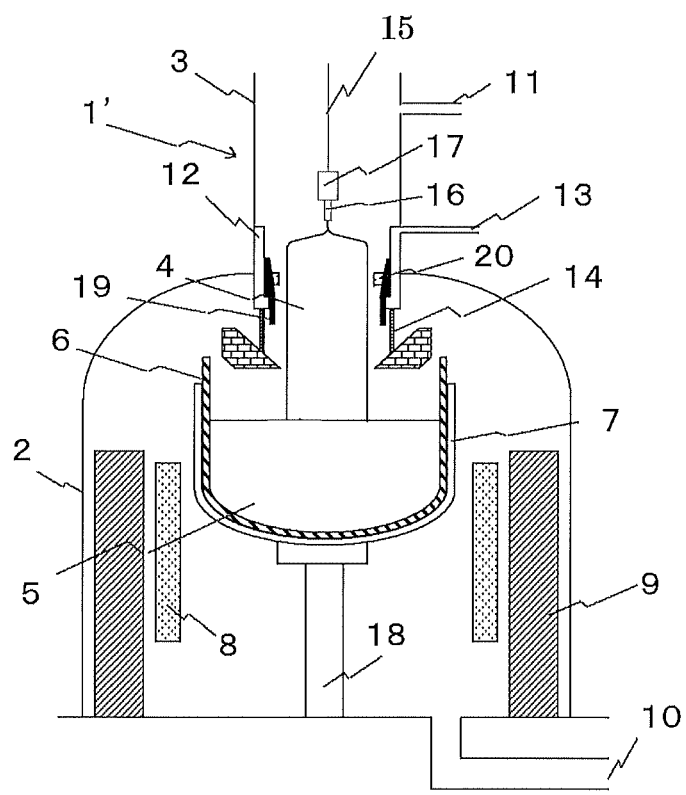
[FIG. 5]
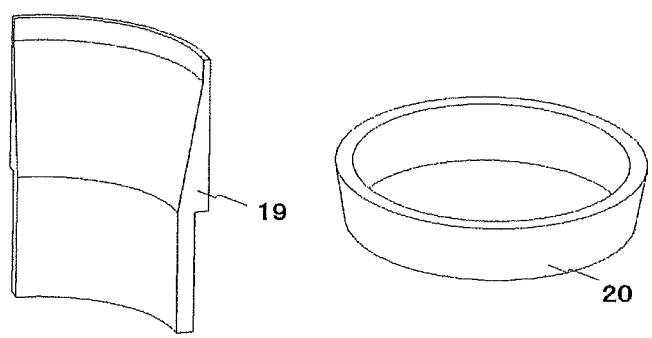

[FIG. 6]
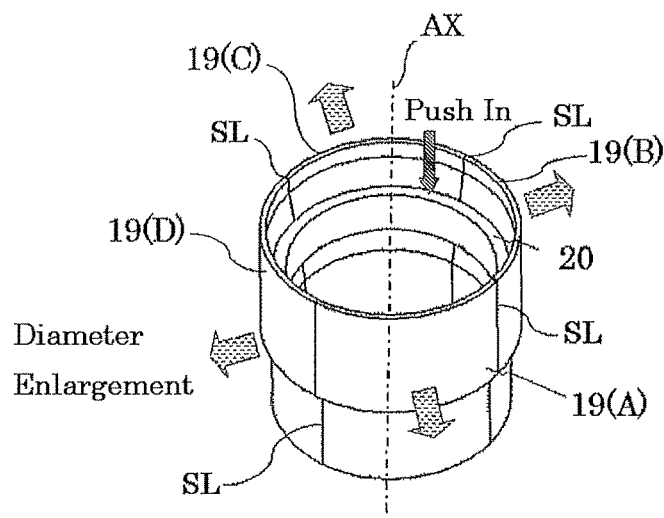
[FIG. 7]
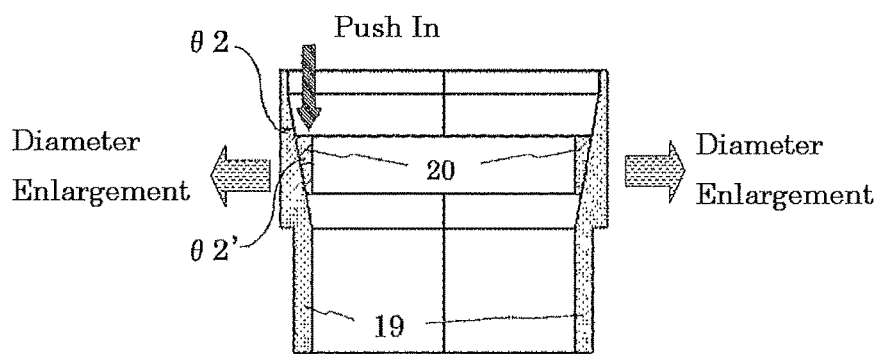
[FIG. 8]
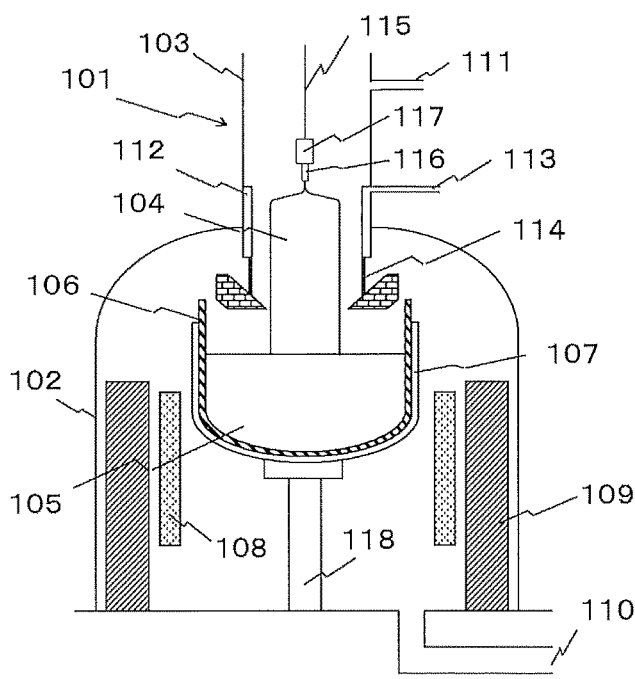

[FIG. 9]
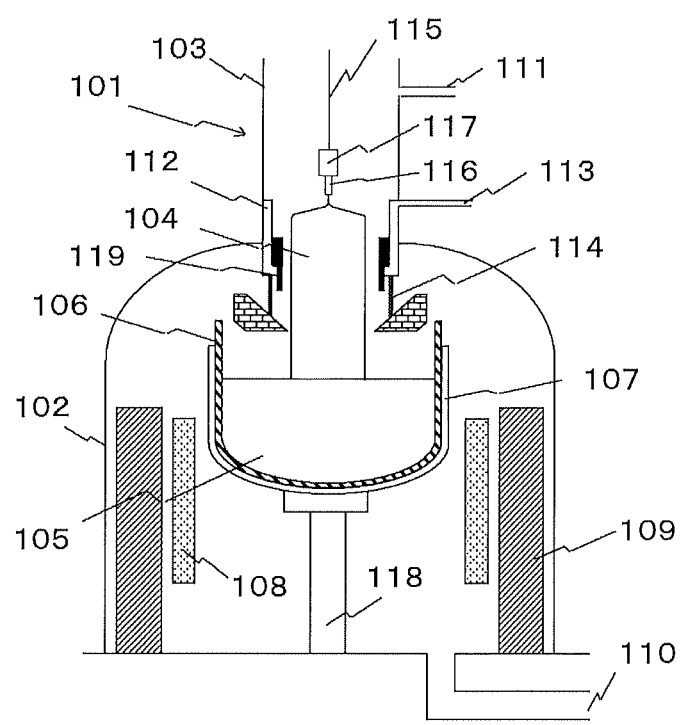

APPARATUS FOR MANUFACTURING SINGLE CRYSTAL

TECHNICAL FIELD

The present invention relates to an apparatus for manufacturing a single crystal according to a Czochralski method (hereinafter, abbreviated as CZ method).

BACKGROUND ART

Hereinafter, a conventional apparatus for manufacturing a single crystal by a Czochralski method will be explained by exemplifying growth of a silicon single crystal.

FIG. 8 shows an example of a conventional apparatus for manufacturing a single crystal.

In a single-crystal manufacturing apparatus 101 used to produce a silicon single crystal by a CZ method, crucibles 106, 107 and a heater 108 are generally arranged in a main chamber 102 where a single crystal 104 is grown. The crucibles 106, 107 accommodate a raw-material melt 105 and can move upwardly and downwardly. The heater 108 is arranged so as to surround the crucibles 106, 107. A pulling chamber 103 for accommodating and taking out the grown single crystal 104 is continuously provided at an upper portion of the main chamber 102. When the single crystal 104 is manufactured using such an apparatus 101 for manufacturing a single crystal, a seed crystal 116 is immersed in the raw-material melt 105 and carefully pulled upward while being rotated to grow the single crystal 104 in the form of rod. Meanwhile, the crucibles 106, 107 are elevated according to the crystal growth so as to maintain the melt surface at a constant height all the time so that desired diameter and crystal quality are obtained.

Moreover, when the single crystal 104 is grown, the seed crystal 116 attached to a seed holder 117 is immersed in the raw-material melt 105, and then a wire 115 is carefully wound up while the seed crystal 116 is being rotated in a desired direction with a pulling mechanism (not shown) to grow the single crystal 104 at an end portion of the seed crystal 116. Here, in order to eliminate dislocations generated when the seed crystal 116 is brought into contact with the melt, the crystal is once made thin to a diameter of about 3 to 5 mm in an early stage of the growth. The diameter is increased up to a desired diameter after the dislocations are eliminated so as to grow the single crystal 104 having desired quality. Alternatively, when a large-diameter crystal is grown, the following method is proposed. For example, the seed crystal 116 to be used is shaped to have an end portion with a sharp-pointed tip end or a truncation thereof, so that the shaped end portion of the seed crystal 116 comes into contact with the silicon melt. First, the tip of the seed crystal 116 is gently brought into contact with the silicon melt. Then, the seed crystal 116 is lowered at such a low rate that the end portion of the seed crystal 116 is melted until a desired thickness is obtained. Subsequently, the seed crystal 116 is slowly elevated to grow a silicon single crystal ingot having a desired diameter without performing necking operation (see Patent document 1).

In these cases, a pulling rate for a constant-diameter portion having an unchanged diameter of the single crystal 104, although depending on the diameter of the single crystal 104 to be pulled, is about 0.4 to 2.0 mm/min and extremely slow. If it is pulled fast by constraint, the single crystal 104 is deformed during the growth and consequently a columnar product having a constant diameter can be no longer obtained. Otherwise, there arise problems, for example: slip dislocations are generated in the single crystal 104; or the single crystal 104 cannot be a product by being detached from the melt. Thus, increasing the crystal growth rate is limited.

However, for the purpose of improving productivity and reducing cost in the foregoing production of the single crystal 104 by the CZ method, increasing the growth rate of the single crystal 104 is one major approach. Accordingly, various improvements have been made in order to achieve the increase in the growth rate of the single crystal 104.

It is known that the growth rate of the single crystal 104 is determined by heat balance of the single crystal 104 during the growth and can be increased by efficiently removing the heat emitted from a surface of the single crystal 104. In this case, an enhancement of a cooling effect on the single crystal 104 enables further efficient production of the single crystal 104. Furthermore, it is known that a cooling speed of the single crystal 104 varies crystal quality. For example, Grown-in defects formed in the silicon single crystal during the growth of the single crystal can be controlled by a ratio between a temperature gradient in the crystal and the pulling rate (growth rate) of the single crystal, and a defect-free single crystal 104 can be grown by controlling the ratio (see Patent document 2). Thus, the enhancement of the cooling effect on the single crystal 104 during the growth is important in manufacturing defect-free crystal and also in improving the productivity by increasing the growth rate of the single crystal 104.

CITATION LIST

Patent Literature

Patent document 1: JP H10-203898 A
Patent document 2: JP H11-157996 A
Patent document 3: JP S57-40119 B2
Patent document 4: JP S64-65086 A
Patent document 5: WO 01/57293 A1
Patent document 6: JP H06-199590 A
Patent document 7: JP 2009-161416 A

SUMMARY OF INVENTION

Technical Problem

In order to efficiently cool the single crystal 104 in the CZ method, there is an effective method in which radiant heat from the single crystal 104 is absorbed into a forcibly-cooled object such as chamber without directly exposing the crystal to radiation from the heater 108. An apparatus structure that can realize this is screen structure (see Patent document 3). However, in this structure, screen shape for avoiding contact with upper ends of the crucibles 106, 107 due to the upward movement of the crucibles 106, 107 needs a screen upper portion with a smaller inner diameter. The screen structure consequently has fault such that it is difficult to cool the crystal. Meanwhile, although an inert gas is allowed to flow during crystal pulling to prevent contamination due to an oxidizing gas, such a screen shape also has a problem such that the cooling effect on the single crystal 104 cannot be expected.

In view of this, there is proposed a structure including: a gas flow-guide cylinder 114 for guiding the inert gas; and a heat-shielding ring for shielding the direct radiation from the heater 108 and the raw-material melt 105 to the gas flow-guide cylinder 114 (see Patent document 4). In this method, the cooling effect of the inert gas on the single crystal 104 can be expected. However, considering the radiant heat from the single crystal 104 is absorbed into a cooling chamber, it cannot be said that the cooling capacity is high.

Thereupon, as a method for solving the problems of the screen and the gas flow-guide cylinder 114 and for efficient cooling, there is proposed a method of arranging a water-cooled cooling cylinder 112 around the crystal (see Patent document 5). In this method, an outside of the cooling cylinder 112 is protected by a cooling-cylinder-protection material such as a protection cover made of graphite etc., and thereby the heat of the single crystal 104 can be efficiently removed from the inside of the cooling cylinder 112. However, since the cooling cylinder 112 does not extend to near the melt surface for safety, the cooling effect on the single crystal 104 is somewhat low in a portion not covered by the cooling cylinder 112.

Moreover, Patent document 6 discloses a method in which a graphite member etc. fitted in the cooling cylinder 112 is extended. However, this method cannot exert a sufficient cooling effect since the cooling cylinder and the extending graphite member are exposed to the heat from the outside. Besides, contact between the cooling cylinder 112 and the graphite member is difficult. Consequently, the heat cannot be efficiently conducted from the graphite member to the cooling cylinder 112.

FIG. 9 shows another exemplary conventional apparatus for manufacturing a single crystal.

This example is characterized by further including an auxiliary cooling cylinder 119, in contrast to the example in FIG. 8. For example, Patent document 7 discloses a method in which the auxiliary cooling cylinder 119 to be fitted into the cooling cylinder 112 is provided to have a slit penetrating in an axial direction, and the auxiliary cooling cylinder 119 extends toward the surface of the raw-material melt 105. In this method, heat generated from the single crystal 104 is conducted to the cooling cylinder 112 through the auxiliary cooling cylinder 119, enabling an improvement in the pulling rate of the single crystal 104. Moreover, the outer diameter of the auxiliary cooling cylinder 119 is made equal to the inner diameter of the cooling cylinder 112, so that the two members can tightly come into close contact with each other.

Nonetheless, recent apparatuses for manufacturing a single crystal have larger sizes. In order that the auxiliary cooling cylinder 119 is smoothly fitted into the cooling cylinder 112 in such an apparatus, it is now necessary to provide a predetermined gap between the two members at the time of installation; in other words, it is necessary to set the outer diameter of the auxiliary cooling cylinder 119 smaller than the inner diameter of the cooling cylinder 112. In this case, due to the dimensional tolerance, the cooling cylinder 112 cannot completely abut on the auxiliary cooling cylinder 119. This brings about a problem of lowered thermal-conduction efficiency from the auxiliary cooling cylinder 119 to the cooling cylinder 112.

The present invention has been made to solve the above problems. An object of the present invention is to provide an apparatus for manufacturing a single crystal that can increase the growth rate of the single crystal by efficiently cooling the single crystal during the growth.

Solution to Problem

To achieve the object, the present invention provides an apparatus for manufacturing a single crystal according to a Czochralski method, the apparatus comprising:

a main chamber configured to house
    a crucible configured to accommodate a raw-material melt, and
    a heater configured to heat the raw-material melt;
a pulling chamber continuously provided at an upper portion of the main chamber and configured to accommodate a single crystal pulled from the raw-material melt;
a cooling cylinder extending from a ceiling portion of the main chamber toward a surface of the raw-material melt so as to surround the single crystal; and
an auxiliary cooling cylinder fitted in an inside of the cooling cylinder, wherein
the apparatus further comprises a diameter-enlargement member configured to fit into the auxiliary cooling cylinder,
the auxiliary cooling cylinder has a slit penetrating therethrough in an axial direction, and
the auxiliary cooling cylinder is configured to tightly come into close contact with the cooling cylinder by pushing the diameter-enlargement member into the auxiliary cooling cylinder to enlarge a diameter of the auxiliary cooling cylinder.

In such an apparatus for manufacturing a single crystal, since the auxiliary cooling cylinder has a slit penetrating in the axial direction, when the diameter-enlargement member is pushed into the auxiliary cooling cylinder, the diameter of the auxiliary cooling cylinder is enlarged. Moreover, the diameter enlargement of the auxiliary cooling cylinder makes the auxiliary cooling cylinder tightly come into close contact with the cooling cylinder surrounding an outer surface of the auxiliary cooling cylinder. Thus, heat of the pulled single crystal is efficiently conducted from the auxiliary cooling cylinder to the cooling cylinder. Therefore, the growing single crystal is efficiently cooled, thereby enabling higher growth rate of the single crystal (crystal pulling rate) and productivity improvement.

Preferably, the diameter-enlargement member has a wedge shape, and is configured to enlarge the diameter of the auxiliary cooling cylinder by partially or thoroughly fitting and pushing the diameter-enlargement member into the slit of the auxiliary cooling cylinder.

The diameter-enlargement member serving as a wedge as in the above-described configuration can enlarge the diameter of the auxiliary cooling cylinder. In this respect, the wedge angle of the diameter-enlargement member is preferably 45° or less in consideration of: a vector of a force acting in a direction in which the diameter of the auxiliary cooling cylinder is enlarged; and a force (return force) to reduce the diameter of the auxiliary cooling cylinder due to the reaction against to the above-described force. Meanwhile, in order to reduce the needed push force by the diameter-enlargement member on the auxiliary cooling cylinder to facilitate the pushing of the diameter-enlargement member into the auxiliary cooling cylinder, the wedge angle is more preferably 5° or more and 20° or less.

Moreover, the slit provided in and penetrating through the auxiliary cooling cylinder in the axial direction has a width of preferably 1% or more and 70% or less of the diameter of the auxiliary cooling cylinder, so that the wedge function is exhibited. In consideration of the pushing force by the wedge and the effect of enlarging the diameter of the auxiliary cooling cylinder, the width is more preferably 5% or more and 20% or less of the diameter.

As a method for pushing the diameter-enlargement member into the auxiliary cooling cylinder, a method in which the diameter-enlargement member is pushed by a manpower can be adopted because the auxiliary cooling cylinder becomes easily deformable by forming a slit in the auxiliary cooling cylinder. However, when hardly-deformable material is used as the auxiliary cooling cylinder, a method using a tool such as a hammer to hit the diameter-enlargement member may also be adopted to enlarge the diameter of the auxiliary cooling cylinder and to surely tightly bring the auxiliary cooling cylinder into close contact with the cooling cylinder.

Note that the longer and the thicker the auxiliary cooling cylinder, the larger the heat capacity. However, the farther the distance between the cooling cylinder and an inner surface of the auxiliary cooling cylinder where heat from the pulled single crystal is absorbed, the lower the effect of cooling the single crystal. Hence, the auxiliary cooling cylinder extends from the cooling cylinder downward in a length of preferably 250 mm or less, and the cooling auxiliary cylinder has a wall thickness of preferably 60 mm or less.

Furthermore, the longer the length of the diameter-enlargement member (the length in the axial direction), the higher the effect of enlarging the diameter of the auxiliary cooling cylinder. Nevertheless, in consideration of the strength of the diameter-enlargement member during the pushing, the length is preferably 10% or more and 60% or less of the length of the auxiliary cooling cylinder. The diameter-enlargement member has a wall thickness of preferably 60 mm or less like the auxiliary cooling cylinder. In this case, when the slit provided in and penetrating through the auxiliary cooling cylinder in the axial direction has a large width, for example, a rectangular parallelepiped corresponding to the width of the slit in the auxiliary cooling cylinder may be connected at a wedge tip of the diameter-enlargement member.

Preferably, the auxiliary cooling cylinder has such a taper shape that an inner diameter at a lower side is smaller, the diameter-enlargement member has such a taper shape that an outer diameter at a lower side is smaller, and the diameter-enlargement member is configured to enlarge the diameter of the auxiliary cooling cylinder by fitting and pushing the diameter-enlargement member into an inside of the auxiliary cooling cylinder.

When both the auxiliary cooling cylinder and the diameter-enlargement member have a taper shape as in the above-described configuration, pushing the diameter-enlargement member into the inside of the auxiliary cooling cylinder causes the diameter-enlargement member to widen the auxiliary cooling cylinder from the inside, thereby achieving the diameter enlargement of the auxiliary cooling cylinder. In this respect, the diameter-enlargement member has a taper angle of preferably 45° or less in consideration of: the vector of the force acting in the direction in which the diameter of the auxiliary cooling cylinder is enlarged; and the force (return force) to reduce the diameter of the auxiliary cooling cylinder due to the reaction against the above-described force. Meanwhile, in order to mitigate the needed push force by the diameter-enlargement member on the auxiliary cooling cylinder and facilitate the pushing of the diameter-enlargement member into the auxiliary cooling cylinder, the taper angle is more preferably 5° or more and 20° or less.

As a method for pushing the diameter-enlargement member into the auxiliary cooling cylinder, a method in which the diameter-enlargement member is pushed by a manpower can be adopted because the auxiliary cooling cylinder with a slit penetrating therethrough in an axial direction is easily deformable, and because dividing the auxiliary cooling cylinder can further facilitate the diameter enlargement. Alternatively, a method using a tool such as a hammer to hit the diameter-enlargement member may also be adopted to enlarge the diameter of the auxiliary cooling cylinder and to surely tightly bring the auxiliary cooling cylinder into close contact with the cooling cylinder.

Additionally, the extent of the diameter-enlargement member to be pushed in depends on the gap (difference) between the inner diameter of the cooling cylinder and the outer diameter of the auxiliary cooling cylinder. For example, when the cooling cylinder has an inner diameter of 430 mm, the diameter-enlargement member is preferably pushed in a distance of 20 mm or less considering the mechanical strength of graphite member. Moreover, the inner diameter of a tapered upper portion in the auxiliary cooling cylinder and the outer diameter of a tapered lower portion in the diameter-enlargement member differ by preferably 20 mm or more and 70 mm or less in order that the diameter-enlargement member comes into contact with the inside of the auxiliary cooling cylinder to enhance the diameter-enlarging effect.

Preferably, a material of the auxiliary cooling cylinder is any of graphite, carbon composite, stainless steel, molybdenum, and tungsten.

These improve the heat conductivity from the auxiliary cooling cylinder to the cooling cylinder, thereby successfully improving the crystal cooling speed.

Preferably, a material of the diameter-enlargement member is any of graphite, carbon composite, stainless steel, molybdenum, and tungsten.

These improve the heat conductivity from the diameter-enlargement member to the auxiliary cooling cylinder, thereby successfully improving the crystal cooling speed.

Advantageous Effects of Invention

As described above, the present invention makes it possible to provide an apparatus for manufacturing a single crystal that can increase the growth rate of the single crystal by efficiently cooling the single crystal during the growth.

BRIEF DESCRIPTION OF DRAWINGS

FIG. 1 is a cross-sectional view showing an example of an apparatus for manufacturing a single crystal according to the present invention.

FIG. 2 is a perspective view showing examples of an auxiliary cooling cylinder and a diameter-enlargement member.

FIG. 3 is a perspective view showing a state where the diameter-enlargement member is fitted in the auxiliary cooling cylinder.

FIG. 4 is a cross-sectional view showing another example of the inventive apparatus for manufacturing a single crystal.

FIG. 5 is a perspective view showing examples of a portion of an auxiliary cooling cylinder and a diameter-enlargement member.

FIG. 6 is a perspective view showing a state where the diameter-enlargement member is fitted in the auxiliary cooling cylinder.

FIG. 7 is a cross-sectional view showing a state where the diameter-enlargement member is fitted in the auxiliary cooling cylinder.

FIG. 8 is a cross-sectional view showing an example of a conventional apparatus for manufacturing a single crystal.

FIG. 9 is a cross-sectional view showing another example of a conventional apparatus for manufacturing a single crystal.

DESCRIPTION OF EMBODIMENTS

As noted above, in single crystal manufacturing according to CZ method, efficiently cooling a single crystal during the growth to increase the growth rate of the single crystal is effective for productivity improvement and cost reduction. For this purpose, there have been proposed structures in which a cooling cylinder surrounding the single crystal during the growth is provided in a main chamber.

In such a structure for cooling a growing single crystal with a cooling cylinder, the cooling cylinder is prevented from coming into contact with a raw-material melt. For this purpose, the cooling cylinder is not extended to near the liquid surface of the raw-material melt; instead, an auxiliary cooling cylinder is fitted inside the cooling cylinder, and the auxiliary cooling cylinder is extended toward the liquid surface of the raw-material melt. In this case, heat generated from the growing single crystal is conducted to the cooling cylinder via the auxiliary cooling cylinder. Nonetheless, along with recent increases in size of apparatuses for manufacturing a single crystal, the outer diameter of an auxiliary cooling cylinder is set smaller than the inner diameter of a cooling cylinder in order to smoothly fit the auxiliary cooling cylinder into the cooling cylinder. This consequently makes it difficult to tightly bring the two into close contact with each other, resulting in a problem that the heat conduction efficiency from the auxiliary cooling cylinder to the cooling cylinder is lowered.

The present inventors have earnestly studied the problems and consequently noticed slit that is provided in and penetrates through an auxiliary cooling cylinder in an axial direction. Specifically, providing the slit in the auxiliary cooling cylinder enables the diameter enlargement of the auxiliary cooling cylinder. For example, even when a predetermined gap is provided between a cooling cylinder and an auxiliary cooling cylinder to facilitate the setting of the auxiliary cooling cylinder, the diameter of the auxiliary cooling cylinder is enlarged after the setting, and thereby, the auxiliary cooling cylinder tightly comes into close contact with the cooling cylinder, successfully improving the heat conduction efficiency from the auxiliary cooling cylinder to the cooling cylinder.

Furthermore, the present inventors have earnestly studied the measures for enlarging the diameter of the auxiliary cooling cylinder. Specifically, in measures in which an auxiliary cooling cylinder is provided with a slit penetrating therethrough in an axial direction and the diameter of the auxiliary cooling cylinder is enlarged by thermal expansion of the auxiliary cooling cylinder, for example, there are dimensional tolerances of the inner diameters of cooling cylinders and the outer diameters of auxiliary cooling cylinders and there are numerous sorts of gaps between two cylinders. Therefore, in the measures, the diameter of the auxiliary cooling cylinder may not be enlarged to an extent enough to surely tightly bring the auxiliary cooling cylinder into close contact with a cooling cylinder.

Accordingly, the present inventors have earnestly studied the measures for enlarging the diameter of the auxiliary cooling cylinder and consequently found that an auxiliary cooling cylinder can be surely tightly brought into close contact with a cooling cylinder by: additionally providing a diameter-enlargement member to be fitted into the auxiliary cooling cylinder; and pushing the diameter-enlargement member therein to enlarge the diameter of the auxiliary cooling cylinder. This finding has led to the completion of the present invention.

Specifically, the present invention is an apparatus for manufacturing a single crystal according to a Czochralski method, the apparatus comprising:
a main chamber configured to house
a crucible configured to accommodate a raw-material melt, and
a heater configured to heat the raw-material melt;
a pulling chamber continuously provided at an upper portion of the main chamber and configured to accommodate a single crystal pulled from the raw-material melt;
a cooling cylinder extending from a ceiling portion of the main chamber toward a surface of the raw-material melt so as to surround the single crystal; and
an auxiliary cooling cylinder fitted in an inside of the cooling cylinder, wherein
the apparatus further comprises a diameter-enlargement member configured to fit into the auxiliary cooling cylinder,
the auxiliary cooling cylinder has a slit penetrating therethrough in an axial direction, and
the auxiliary cooling cylinder is configured to tightly come into close contact with the cooling cylinder by pushing the diameter-enlargement member into the auxiliary cooling cylinder to enlarge a diameter of the auxiliary cooling cylinder.

Hereinafter, embodiments of the present invention will be specifically described based on the accompanying drawings, but the present invention is not limited thereto.

FIG. 1 shows an example of the apparatus for manufacturing a single crystal according to the present invention.

In an apparatus 1 for manufacturing a single crystal, a quartz crucible 6 is configured to accommodate a raw-material melt (for example, silicon melt) 5. A heater 8 is configured to heat and melt a crystal raw material (for example, polycrystalline silicon) to form a raw-material melt 5, and also to keep the raw-material melt 5 at appropriate temperature. At a tip of a pulling wire 15, a seed holder 17 for attaching a seed crystal 16 is connected.

The quartz crucible 6 is installed while being held by a graphite crucible 7. The graphite crucible 7 is supported by a crucible rotation shaft (support axis) 18 configured to rotate around the center of the bottom portion of the graphite crucible 7 and to move vertically. A pulling chamber 3 is provided at an upper portion of a main chamber 2. The pulling chamber 3 is provided with an opening door for taking out a single crystal (for example, silicon single crystal) 4 pulled from the raw-material melt 5.

The pulling chamber 3 is provided with a gas inlet 11 for introducing an atmospheric gas (for example, Ar gas). The main chamber 2 is provided, at the bottom portion thereof, with a gas outlet 10 for discharging the introduced atmospheric gas. While an atmospheric gas is introduced through the gas inlet 11, the seed crystal 16 is immersed in the raw-material melt 5. The pulling wire 15 is wound up while being rotated to pull the single crystal 4.

The quartz crucible 6 and the graphite crucible 7 are capable of moving upward/downward in an axial direction of crystal growth with the aid of the crucible rotation shaft 18. The quartz crucible 6 and the graphite crucible 7 are elevated to compensate for lowered liquid surface of the raw-material melt 5 which is crystallized and thus reduced during the crystal growth. Moreover, a heat insulating member 9 surrounds outer sides of the heater 8 (the sides are opposite sides to the crucibles 6, 7) to protect the main chamber 2 from direct radiant heat of the heater 8 and also prevent heat loss of the melted raw-material melt 5.

Moreover, to improve the growth rate of the single crystal 4, the single crystal 4 needs to be cooled rapidly. For this purpose, a cooling cylinder 12 is provided. The cooling cylinder 12 is made of, for example, a metal, and surrounds the pulled single crystal 4 coaxially. Further, the cooling cylinder 12 has a hollow inner structure. A coolant (for example, water etc.) introduced from a coolant inlet 13 circulates inside the hollow of the cooling cylinder 12 to cool the cooling cylinder 12, and is then discharged to the outside.

A gas flow-guide cylinder 14 coaxially surrounds the pulled single crystal 4, and extends from a lower end of the cooling cylinder 12 downwardly of the cooling cylinder 12. The gas flow-guide cylinder 14 has an effect of guiding an inert gas introduced from the gas inlet 11, and is configured to shield radiant heat from the heater 8 and the raw-material melt 5 to enhance the cooling effect on the single crystal 4. Moreover, the gas flow-guide cylinder 14 is located below the lower end portion of the cooling cylinder 12, so that the gas flow-guide cylinder 14 also has an effect of preventing the cooling cylinder 12 from coming into contact with the raw-material melt 5 and from causing phreatic explosion.

An auxiliary cooling cylinder 19 is configured to fit into an inside of the cooling cylinder 12. One of roles of the auxiliary cooling cylinder 19 is to absorb radiation heat originated from the pulled single crystal 4 and to transfer absorbed heat to the cooling cylinder 12. For this purpose, the auxiliary cooling cylinder 19 coaxially surrounds the pulled single crystal 4 and extends more downwardly than the lower end of the cooling cylinder 12. In this case, since the auxiliary cooling cylinder 19 may also surround a lower portion of the single crystal 4, it is possible to efficiently conduct heat from the single crystal 4 to the cooling cylinder 12 through the auxiliary cooling cylinder 19.

In this event, to maximize the cooling effect on the single crystal 4, it is important to tightly bring the auxiliary cooling cylinder 19 into close contact with the cooling cylinder 12 in such a manner that the heat is efficiently transferred from the auxiliary cooling cylinder 19 to the cooling cylinder 12. For this purpose, the present invention adopts a diameter-enlargement member 20 configured to fit into the auxiliary cooling cylinder 19, and the diameter-enlargement member 20 is pushed into the auxiliary cooling cylinder 19 to enlarge the diameter thereof, so that the enlarged auxiliary cooling cylinder 19 tightly comes into close contact with the cooling cylinder 12. Hereinbelow, specific examples of enlarging the diameter of the auxiliary cooling cylinder 19 will be described.

FIG. 2 shows examples of the auxiliary cooling cylinder and the diameter-enlargement member.

The auxiliary cooling cylinder 19 has a cylindrical shape with an axis AX as the center. The axis AX substantially matches a crystal growth axis in growing the single crystal.

The auxiliary cooling cylinder 19 has a slit SL penetrating therethrough in an axial direction of the auxiliary cooling cylinder 19. The slit SL has an upper portion that is cut into a V-letter shape to form a fit section F. The slit SL has an effect of facilitating the setting of the auxiliary cooling cylinder 19. Moreover, the fit section F is configured to fit into the diameter-enlargement member 20 and thereby exhibits an effect of enlarging the diameter of the auxiliary cooling cylinder 19. In this example, the fit section F has a shape of inverted triangle, and an angle $\theta 1'$ at the lowest end (an apex of the inverted triangle) is set at, for example, 5° or more and 20° or less.

The diameter-enlargement member 20 having a wedge shape is configured to fit into a portion or all of the fit section F. As a specific example, the diameter-enlargement member 20 has such a shape of inverted triangle that the width is narrowed toward a lower end thereof. The lowest end (the apex of the inverted triangle) has a taper angle (wedge angle) $\theta 1$ preferably set at identical to the angle $\theta 1'$ of the fit section F, for example, 5° or more and 20° or less.

When the auxiliary cooling cylinder 19 and the diameter-enlargement member 20 as described above are used to fit and push the diameter-enlargement member 20 into the auxiliary cooling cylinder 19, the pressure for pushing the diameter-enlargement member 20 is converted to a force for enlarging the diameter of the auxiliary cooling cylinder 19, thereby enlarging the diameter of the auxiliary cooling cylinder 19 as shown in FIG. 3. Consequently, the auxiliary cooling cylinder 19 surely tightly comes into close contact with the cooling cylinder 12 (see FIG. 1). Note that the auxiliary cooling cylinder 19 and the diameter-enlargement member 20 are preferably made of a material excellent in heat resistance and high in heat conductivity and emissivity. The material is preferably, for example, any of graphite, carbon composite (CC material), stainless steel, molybdenum, and tungsten.

FIG. 4 shows another example of the inventive apparatus for manufacturing a single crystal.

An apparatus 1' for manufacturing a single crystal shown in this figure is the same as the apparatus 1 for manufacturing a single crystal in FIG. 1, except that the auxiliary cooling cylinder 19 and the diameter-enlargement member 20 are different in comparison with the apparatus 1 for manufacturing a single crystal in FIG. 1. Hence, hereinafter, description will be given of the auxiliary cooling cylinder 19 and the diameter-enlargement member 20. The other constitutive elements are denoted by the same signs as in FIG. 1 and detailed descriptions thereof are omitted.

FIG. 5 shows examples of a portion of the auxiliary cooling cylinder and the diameter-enlargement member. FIG. 6 and FIG. 7 show states where the diameter-enlargement member is fitted in the auxiliary cooling cylinder.

The auxiliary cooling cylinder 19 has four slits SL penetrating therethrough in the axial direction. These four slits SL divide the auxiliary cooling cylinder 19 into four parts A, B, C, and D. In other words, when these four parts A, B, C, and D are combined together, the auxiliary cooling cylinder 19 forms a cylindrical shape with the axis AX as the center. Note that the auxiliary cooling cylinder 19 shown in FIG. 5 corresponds to one of the four parts A, B, C, and D in FIG. 6.

As shown in FIG. 7, the auxiliary cooling cylinder 19 has such a taper shape that an upper portion thereof has an oblique inner surface, and that an inner diameter at a lower side is smaller, i.e., a cross-sectional width is narrowed toward the upper end. Meanwhile, the diameter-enlargement member 20 has a ring shape that fits inside the auxiliary cooling cylinder 19. Moreover, the diameter-enlargement member 20 has such a taper shape that a lower portion thereof has an oblique outer surface, and that an outer diameter at a lower side is smaller, i.e., a cross-sectional width is narrowed toward the lower end.

Meanwhile, supposing that an angle between the inner surface and the outer surface of the auxiliary cooling cylinder 19 is represented by a taper angle $\theta 2$, the taper angle $\theta 2$ is set at, for example, 5° or more and 20° or less. Likewise, supposing that an angle formed between the inner surface and the outer surface of the diameter-enlargement member 20 is represented by a taper angle $\theta 2'$, the taper angle θ2' is preferably set to be identical to the taper angle θ2 of the auxiliary cooling cylinder 19, for example, at 5° or more and 20° or less.

When such auxiliary cooling cylinder 19 and diameter-enlargement member 20 are used to fit and push the diameter-enlargement member 20 into the auxiliary cooling cylinder 19, the pressure for pushing the diameter-enlargement member 20 is converted to a force for enlarging the diameter of the auxiliary cooling cylinder 19, thereby enlarging the diameter of the auxiliary cooling cylinder 19 as shown in FIGS. 6 and 7. Consequently, the auxiliary cooling cylinder 19 surely tightly comes into close contact with the cooling cylinder 12 (see FIG. 4). Note that the auxiliary cooling cylinder 19 and the diameter-enlargement member 20 are preferably made of a material excellent in heat resistance and high in heat conductivity and emissivity. The material is preferably, for example, any of graphite, carbon composite (CC material), stainless steel, molybdenum, and tungsten.

As has been described above, in the inventive apparatuses for manufacturing a single crystal, the auxiliary cooling cylinder 19 has the slit(s) SL penetrating therethrough in the axial direction. Accordingly, when the diameter-enlargement member 20 is pushed into the auxiliary cooling cylinder 19, the diameter of the auxiliary cooling cylinder 19 is enlarged. In addition, enlarging the diameter of the auxiliary cooling cylinder 19 makes the auxiliary cooling cylinder 19 tightly come into close contact with the cooling cylinder 12 surrounding the outer surface of the auxiliary cooling cylinder 19. Thereby, the heat of the pulled single crystal 4 is efficiently conducted from the auxiliary cooling cylinder 19 to the cooling cylinder 12. Thus, the single crystal 4 during the growth is efficiently cooled, and the efficiently cooling makes it possible to increase growth rate of the single crystal 4 (crystal pulling rate) and improve the productivity.

EXAMPLES

Hereinafter, the present invention will be described in detail with reference to Examples of the present invention. However, the present invention is not limited thereto.

Example 1

In Example 1, single crystals 4 were grown by employing the apparatus 1 for manufacturing a single crystal as shown in FIG. 1 installed under the following conditions. A crystal pulling rate for manufacturing the single crystal 4 having desired quality was verified.

The single crystals 4 to be grown were silicon single crystals. The silicon crystals, which had a diameter of 12 inches (300 mm), were manufactured by the magnetic field applied Czochralski method (MCZ method). The quartz crucible 6 had a diameter of 32 inches (800 mm). The designed value of the inner diameter of the cooling cylinder 12 was 430 mm. The designed value of the outer diameter of the auxiliary cooling cylinder 19 was 429.5 mm, and the length was 350 mm. The tolerances of the inner diameter of the cooling cylinder 12 and the outer diameter of the auxiliary cooling cylinder 19 employed were respectively ±0.4 mm and ±0.1 mm.

The auxiliary cooling cylinder 19 employed had the slit SL penetrating therethrough in the axial direction as shown in FIG. 2, and the slit SL had an upper portion cut into a V-letter shape to form the fit section F. Moreover, the diameter-enlargement member 20 employed had a wedge shape, which fits into a portion or all of the fit section F. Specifically, the diameter-enlargement member 20 had a shape of inverted triangle whose width is narrowed toward the lower end, and the taper angle θ1 at the lowest end was set to 10°. Similarly, the fit section F of the auxiliary cooling cylinder 19 also had an inverted-triangular shape, and the angle θ1' at the lowest end was set to 10°.

In such apparatus 1 for manufacturing a single crystal immediately after the setting of the auxiliary cooling cylinder 19, the gap (difference) between the inner diameter of the cooling cylinder 12 and the outer diameter of the auxiliary cooling cylinder 19 was 0.8 mm. After the diameter-enlargement member 20 was fitted into the auxiliary cooling cylinder 19 and the diameter-enlargement member 20 was pushed therein, the auxiliary cooling cylinder 19 was enlarged to such a desired diameter that the gap between the inner diameter of the cooling cylinder 12 and the outer diameter of the auxiliary cooling cylinder 19 became 0 mm. In other words, the auxiliary cooling cylinder 19 tightly came into close contact with the cooling cylinder 12 without any gap. Note that a graphite material having equivalent heat conductivity to metals and higher emissivity than metals was employed as the material of the auxiliary cooling cylinder 19 and the diameter-enlargement member 20.

Further, while the cooling cylinder 12 and the auxiliary cooling cylinder 19 were tightly in close contact with each other owing to the diameter-enlargement member 20, single crystals 4 were grown and a growth rate at which all the crystal was defect-free was determined. Since the margin of the growth rate to obtain defect-free crystal is quite narrow, the appropriate growth rate to obtain the single crystal 4 as thoroughly defect-free crystal is easily determined by: slicing each pulled single crystal 4 into samples, and then checking whether the samples are defect-free crystal or not. In Example 1, whether such samples were defect-free crystal or not was checked by selective etching to determine a growth rate at which all the crystal was defect-free.

Comparative Example 1

In Comparative Example 1, the apparatus 101 for manufacturing a single crystal as shown in FIG. 8 was employed to determine a growth rate at which all the single crystal 104 was defect-free crystal. More specifically, in Comparative Example 1, the growth rate was evaluated by using the apparatus 101 for manufacturing a single crystal with no auxiliary cooling cylinder.

Note that, in Comparative Example 1, single crystals 104 were manufactured under the same conditions as in Example 1 and the evaluation was performed as in Example 1, except that the apparatus for manufacturing a single crystal as shown in FIG. 8 was employed.

Moreover, in FIGS. 8, 102, 103, 104, 105, 106, 107, 108, 109, 110, 111, 112, 113, 114, 115, 116, 117, and 118 respectively correspond to the main chamber 2, the pulling chamber 3, the single crystal 4, the raw-material melt 5, the quartz crucible 6, the graphite crucible 7, the heater 8, the heat insulating member 9, the gas outlet 10, the gas inlet 11, the cooling cylinder 12, the coolant inlet 13, the gas flow-guide cylinder 14, the pulling wire 15, the seed crystal 16, the seed holder 17, and the crucible rotation shaft 18 in FIG. 1.

Comparative Example 2

In Comparative Example 2, the apparatus 101 for manufacturing a single crystal as shown in FIG. 9 was employed to determine a growth rate at which all the single crystal 104 was defect-free crystal. More specifically, in Comparative Example 2, the growth rate was evaluated by using the apparatus 101 for manufacturing a single crystal with an auxiliary cooling cylinder but no diameter-enlargement member.

Note that, in Comparative Example 2, single crystals 104 were manufactured under the same conditions as in Example 1 and the evaluation was performed as in Example 1, except that the apparatus for manufacturing a single crystal as shown in FIG. 9 was employed.

Moreover, in FIG. 9, the same components as those in FIG. 8 are denoted by the same signs as in FIG. 8. Further, 119 in FIG. 9 corresponds to the auxiliary cooling cylinder 19 in FIG. 1.

Table 1 shows the crystal pulling rates (growth rates) at which all the pulled single crystal was defect-free crystal in Example 1, Comparative Example 1, and Comparative Example 2.

TABLE 1

Comparison of crystal pulling rates among Example 1, Comparative Example 1, and Comparative Example 2

| Configuration | Crystal Pulling Rate |
| --- | --- |
| No Auxiliary Cooling Cylinder (Comparative Example 1) | 1.000 |
| Only Auxiliary Cooling Cylinder (Comparative Example 2) | 1.058 |
| Auxiliary Cooling Cylinder + Diameter-Enlargement Member (Example 1) | 1.105 |

As apparent from Table 1, the growth rate in Example 1 was higher by approximately 10.5% than that in Comparative Example 1 using no auxiliary cooling cylinder. Moreover, the growth rate in Example 1 was higher by approximately 4.4% than that in Comparative Example 2 employing the auxiliary cooling cylinder but not the diameter-enlargement member.

Example 2

In Example 2, single crystals 4 were grown employing the apparatus 1' for manufacturing a single crystal as shown in FIG. 4 installed under the following conditions. A crystal pulling rate for manufacturing the single crystal 4 having desired quality was verified.

The single crystals 4 to be grown were silicon single crystals. The single crystals were manufactured under the same conditions as in Example 1 and the evaluation was performed as in Example 1, except that the auxiliary cooling cylinder 19 and the diameter-enlargement member 20 as shown in FIG. 5 were used. Specifically, the designed value of the inner diameter of the cooling cylinder 12 was 430 mm, the designed value of the outer diameter of the auxiliary cooling cylinder 19 was 429.5 mm, and the length was 350 mm. Additionally, the tolerances of the inner diameter of the cooling cylinder 12 and the outer diameter of the auxiliary cooling cylinder 19 employed were respectively ±0.4 mm and ±0.1 mm.

The auxiliary cooling cylinder 19 employed had four slits SL penetrating therethrough in the axial direction as shown in FIG. 6. The auxiliary cooling cylinder 19 were divided into four parts A, B, C, and D by these four slits SL. Moreover, as shown in FIG. 7, the auxiliary cooling cylinder 19 employed had such a taper shape that the upper portion had an oblique inner surface, and that the width of the cross-sectional shape was narrowed toward the upper end. Meanwhile, the diameter-enlargement member 20 employed had a ring shape that fitted in the inside of the auxiliary cooling cylinder 19 as shown in FIG. 7. Moreover, the diameter-enlargement member 20 employed had such a taper shape that the lower portion had an oblique outer surface, and that the width of the cross-sectional shape was narrowed toward the lower end.

Further, both of the taper angle $\theta 2$ between the inner surface and the outer surface of the auxiliary cooling cylinder 19, and the taper angle $\theta 2'$ between the inner surface and the outer surface of the diameter-enlargement member 20 were set to 10°.

In such apparatus 1' for manufacturing a single crystal immediately after the setting of the auxiliary cooling cylinder 19, the gap (difference) between the inner diameter of the cooling cylinder 12 and the outer diameter of the auxiliary cooling cylinder 19 was 0.8 mm. After the diameter-enlargement member 20 was fitted into the auxiliary cooling cylinder 19 and the diameter-enlargement member 20 was pushed therein, the four parts of the auxiliary cooling cylinder 19 moved in the respective diameter directions. Thereby, the auxiliary cooling cylinder 19 was enlarged to such a desired diameter that the gap between the inner diameter of the cooling cylinder 12 and the outer diameter of the auxiliary cooling cylinder 19 became 0 mm. In other words, the auxiliary cooling cylinder 19 tightly came into close contact with the cooling cylinder 12 without any gap.

Table 2 shows the crystal pulling rates (growth rates) at which all the pulled single crystal was defect-free crystal in Example 2, Comparative Example 1, and Comparative Example 2.

TABLE 2

Comparison of crystal pulling rates among Example 2, Comparative Example 1, and Comparative Example 2

| Configuration | Crystal Pulling Rate |
| --- | --- |
| No Auxiliary Cooling Cylinder (Comparative Example 1) | 1.000 |
| Only Auxiliary Cooling Cylinder (Comparative Example 2) | 1.058 |
| Auxiliary Cooling Cylinder + Diameter-Enlargement Member (Example 2) | 1.102 |

As apparent from Table 2, the growth rate in Example 2 was higher by approximately 10.2% than that in Comparative Example 1 using no auxiliary cooling cylinder. Moreover, the growth rate in Example 2 was higher by approximately 4.1% than that in Comparative Example 2 using the auxiliary cooling cylinder but not the diameter-enlargement member. Therefore, in Example 2 also, higher growth rate was achieved as in Example 1.

As can be seen from the above results, in both of Examples 1 and 2, the growth rate of the single crystal 4 were successfully increased in comparison with Comparative Examples 1 and 2. These revealed that the inventive apparatuses 1, 1' for manufacturing a single crystal are capable of efficiently cooling the single crystal 4 during the growth and increasing the growth rate of the single crystal 4.

As has been described hereinabove, the present invention makes it possible to increase the outer diameter of the auxiliary cooling cylinder 19 by fitting and pushing the diameter-enlargement member 20 into the auxiliary cooling cylinder 19. As a result, the degree of contact between the auxiliary cooling cylinder 19 and the cooling cylinder 12 is satisfactorily increased, enabling efficient cooling of the single crystal 4 during the growth. In other words, the growth rate of the single crystal 4 can be increased by efficiently cooling the single crystal 4 during the growth.

It should be noted that the present invention is not limited to the above-described embodiments. The embodiments are just examples, and any examples that substantially have the same feature and demonstrate the same functions and effects as those in the technical concept disclosed in claims of the present invention are included in the technical scope of the present invention.

The invention claimed is:

1. An apparatus for manufacturing a single crystal according to a Czochralski method, the apparatus comprising:
    a main chamber configured to house
        a crucible configured to accommodate a raw-material melt, and
        a heater configured to heat the raw-material melt;
    a pulling chamber continuously provided at an upper portion of the main chamber and configured to accommodate a single crystal pulled from the raw-material melt;
    a cooling cylinder extending from a ceiling portion of the main chamber toward a surface of the raw-material melt so as to surround the single crystal; and
    an auxiliary cooling cylinder fitted in an inside of the cooling cylinder, wherein
    the apparatus further comprises a diameter-enlargement member configured to fit into the auxiliary cooling cylinder,
    the auxiliary cooling cylinder has a slit penetrating therethrough in an axial direction, and
    the auxiliary cooling cylinder is configured to tightly come into close contact with the cooling cylinder by pushing the diameter-enlargement member into the auxiliary cooling cylinder to enlarge a diameter of the auxiliary cooling cylinder.

2. The apparatus for manufacturing a single crystal according to claim 1, wherein the diameter-enlargement member has a wedge shape, and is configured to enlarge the diameter of the auxiliary cooling cylinder by partially or thoroughly fitting and pushing the diameter-enlargement member into the slit of the auxiliary cooling cylinder.

3. The apparatus for manufacturing a single crystal according to claim 1, wherein
    the auxiliary cooling cylinder has such a taper shape that an inner diameter at a lower side is smaller,
    the diameter-enlargement member has such a taper shape that an outer diameter at a lower side is smaller, and,
    the diameter-enlargement member is configured to enlarge the diameter of the auxiliary cooling cylinder by fitting and pushing the diameter-enlargement member into an inside of the auxiliary cooling cylinder.

4. The apparatus for manufacturing a single crystal according to claim 1, wherein a material of the auxiliary cooling cylinder is any of graphite, carbon composite, stainless steel, molybdenum, and tungsten.

5. The apparatus for manufacturing a single crystal according to claim 2, wherein a material of the auxiliary cooling cylinder is any of graphite, carbon composite, stainless steel, molybdenum, and tungsten.

6. The apparatus for manufacturing a single crystal according to claim 3, wherein a material of the auxiliary cooling cylinder is any of graphite, carbon composite, stainless steel, molybdenum, and tungsten.

7. The apparatus for manufacturing a single crystal according to claim 1, wherein a material of the diameter-enlargement member is any of graphite, carbon composite, stainless steel, molybdenum, and tungsten.

8. The apparatus for manufacturing a single crystal according to claim 2, wherein a material of the diameter-enlargement member is any of graphite, carbon composite, stainless steel, molybdenum, and tungsten.

9. The apparatus for manufacturing a single crystal according to claim 3, wherein a material of the diameter-enlargement member is any of graphite, carbon composite, stainless steel, molybdenum, and tungsten.

10. The apparatus for manufacturing a single crystal according to claim 4, wherein a material of the diameter-enlargement member is any of graphite, carbon composite, stainless steel, molybdenum, and tungsten.

11. The apparatus for manufacturing a single crystal according to claim 5, wherein a material of the diameter-enlargement member is any of graphite, carbon composite, stainless steel, molybdenum, and tungsten.

12. The apparatus for manufacturing a single crystal according to claim 6, wherein a material of the diameter-enlargement member is any of graphite, carbon composite, stainless steel, molybdenum, and tungsten.

* * * * *